(12) United States Patent
Saado

(10) Patent No.: US 7,157,978 B2
(45) Date of Patent: Jan. 2, 2007

(54) METHOD AND SYSTEM FOR A LOCK DETECTOR FOR A PHASE-LOCKED LOOP

(75) Inventor: Alon Saado, San Diego, CA (US)

(73) Assignee: Via Telecom Co., Ltd., Grand Cayman British (BB)

( * ) Notice: Subject to any disclaimer, the term of this patent is extended or adjusted under 35 U.S.C. 154(b) by 109 days.

(21) Appl. No.: 11/101,985

(22) Filed: Apr. 8, 2005

(65) Prior Publication Data

US 2006/0226914 A1    Oct. 12, 2006

(51) Int. Cl.
*H03L 7/095* (2006.01)

(52) U.S. Cl. ............ 331/1 A; 331/25; 331/DIG. 2

(58) Field of Classification Search ............ 331/1 A, 331/4, 8, 18, 25, DIG. 2
See application file for complete search history.

(56) References Cited

U.S. PATENT DOCUMENTS 6,794,944 B1 * 9/2004 Hirai ............ 331/1 A

* cited by examiner

*Primary Examiner*—David Mis
(74) *Attorney, Agent, or Firm*—Preston Gates & Ellis LLP

(57) ABSTRACT

A lock detector receives a feedback signal from a phase-locked loop and a reference signal. The lock detector includes a first generator for receiving the reference and feedback signals, and for sampling the feedback signal with the reference signal. A second generator is coupled to the first generator for incrementing a count when the feedback signal is at different polarities at consecutive edges of the reference signal. An output line, for asserting a phase lock when the count reaches a defined value, is coupled to the second generator.

20 Claims, 4 Drawing Sheets

METHOD AND SYSTEM FOR A LOCK DETECTOR FOR A PHASE-LOCKED LOOP

FIELD OF THE INVENTION

The present invention relates to phase-locked loops in general, and more particularly to a lock detector for a phase-locked loop.

BACKGROUND OF THE INVENTION

Modern electronics, particularly integrated circuits (IC), often contain phase-locked loops (PLL) for providing frequency clocks to the IC. A PLL is a closed loop frequency control system that operates on the phased sensitive detection of phase difference between two signals, the reference signal and a feedback signal. Upon activation, a certain amount of time is needed in order for the PLL to settle in to a stable and locked frequency. This settling time varies, but it is important for the PLL to stabilize before its output may be used.

One solution to having a stable PLL output is to simulate the PLL and find the point at which it reaches stability, or lock, in varying conditions. By taking the worst case scenario, and adding some safety margin, a default waiting period may be established after which its assumed the PLL output is stable and may be used. One problem with this is that the PLL may cycle in a locked mode for some period of time before its output is used, delaying execution of the IC function.

Another solution, which implements analog circuits, uses a phase frequency detector to determine when a PLL is locked. However, combining analog circuits with digital circuits is complex.

A third solution clocks a counter by the reference signal and a counter by the feedback signal, while a control unit enables both counters for a defined time interval. At the end of the time interval, the control unit compares the output of the two counters, and asserts a phase lock indicator if the counts are equal. One problem with this solution is that it requires several components and is complex.

Accordingly, what is needed is a method and system for a lock detector that can be added to an existing PLL system that is simple to implement. The present invention addresses such a need.

BRIEF SUMMARY OF THE INVENTION

The present invention provides a lock detector that receives a feedback signal from a phase-locked loop and a reference signal. The lock detector includes a first generator for receiving the reference and feedback signals, and for sampling the feedback signal with the reference signal. A second generator is coupled to the first generator for incrementing a counter when the feedback signal is at different polarities at consecutive rising and falling edges of the reference signal. An output line, for asserting a phase lock when the count reaches a defined value, is coupled to the second generator. The defined value may be determined by simulations of the amount of time it takes for a PLL to stabilize. The simulations can give a range, and the pre-defined number may be the low end or the average, for example.

DETAILED DESCRIPTION OF THE INVENTION

The present invention relates to a method and system for a lock detector for a phase-locked loop (PLL). The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
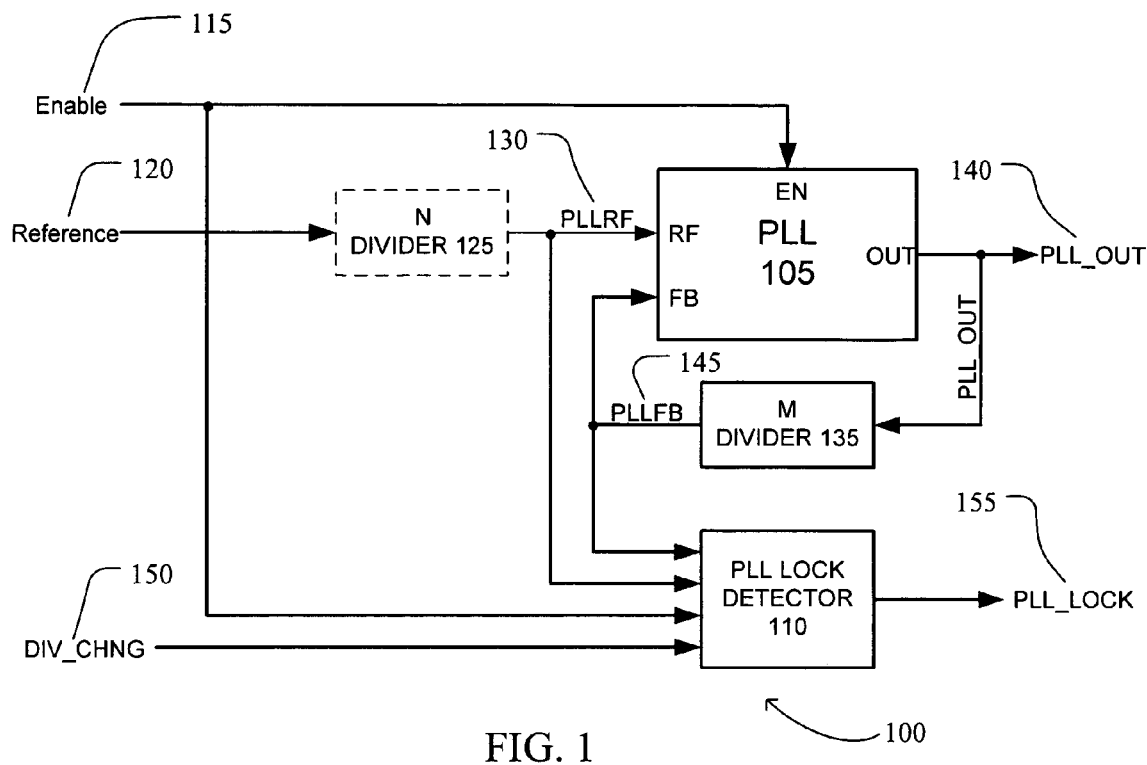
FIG. 1 is a block diagram illustrating one embodiment of a system with a phase-locked loop (PLL) and a PLL lock detector.

FIG. 1 is a block diagram illustrating one embodiment of system 100 with phase-locked loop (PLL) 105 and PLL lock detector 110. System 100 may be separate components or may be an integrated circuit (IC) on a single chip. System 100 may include dividers 125 and 135.

In order to activate system 100, enable signal 115 is asserted at both PLL 105 and lock detector 110. Reference signal 120 is also provided to system 100, and may be received by optional divider 125. Divider 125 may divide reference signal 120 by an integer N, producing PLL reference signal (PLLRF) 130 to PLL 105 and lock detector 110.

PLL 105 begins outputting PLL output (PLL_OUT) 140, which exits system 100 and is input to divider 135. Divider 135 divides PLL output 140 by an integer M, producing PLL feedback signal (PLLFB) 145 to PLL 105 and lock detector 110. PLL output 140 may be expressed as reference signal 120 multiplied by M/N. Integers M and N are typically adjustable. If integers N or M are changed, then divider change signal 150 may be transmitted to lock detector 110 in order to reset phase lock detection while PLL 105 locks onto the new frequency. When lock detector 110 detects phase lock, the phase lock signal is asserted on output line 155.

Figure 6:
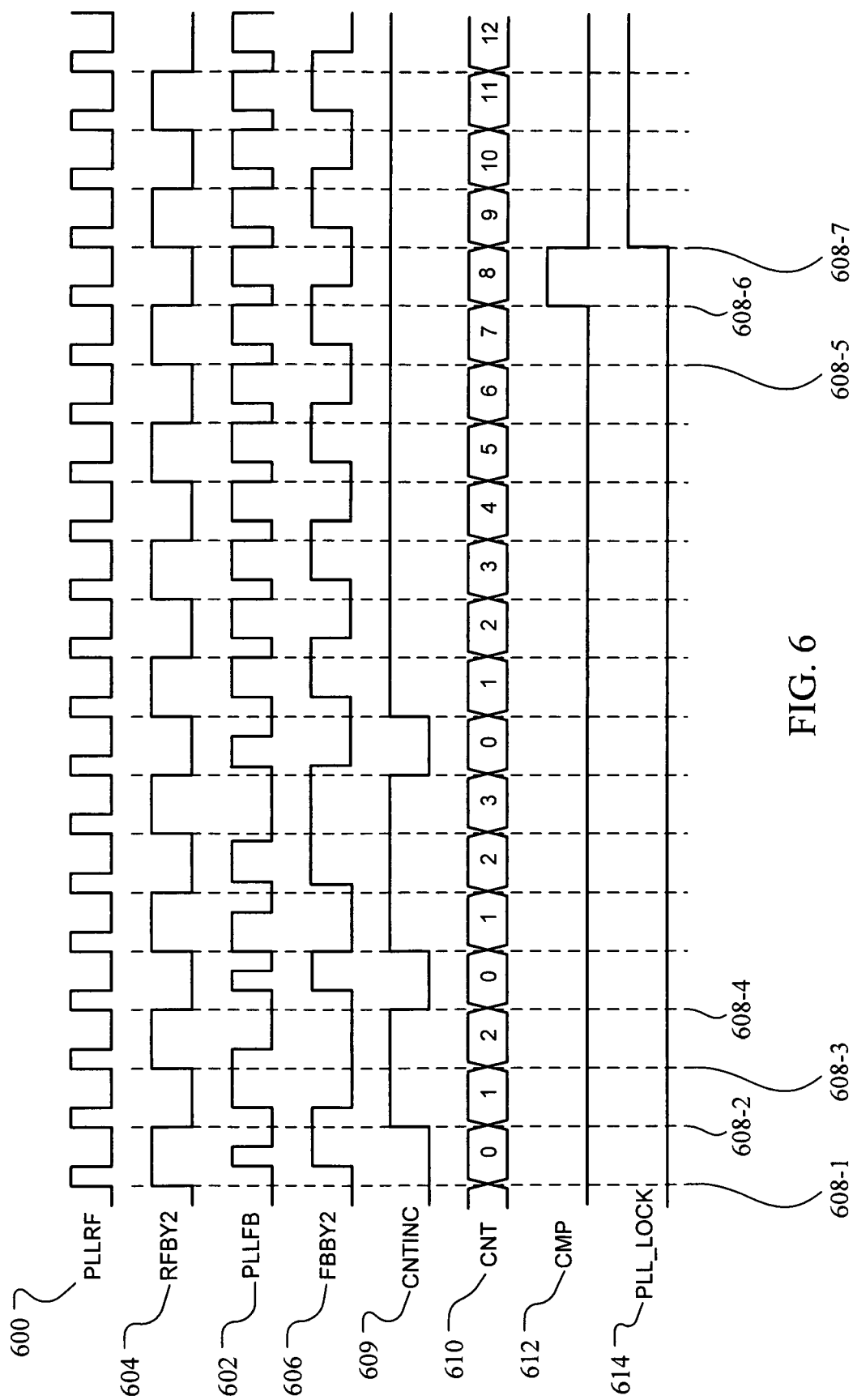
FIG. 6 is a timing diagram illustrating signaling in one embodiment of the invention.

Dividers 125 and 135 may output signals so that the period of time at which PLL output 140 is high is the same amount of time in which PLL output 140 is low. This is also known as a 50% duty cycle. Referring momentarily to FIG. 6, wave 604 is an example of a signal with a 50% duty cycle, while waves 600 and 602 do not have a 50% duty cycle.

The following description avoids explanation of the operation of a PLL in order to more closely focus on the invention. PLL operation is well known in the art.

Figure 2:
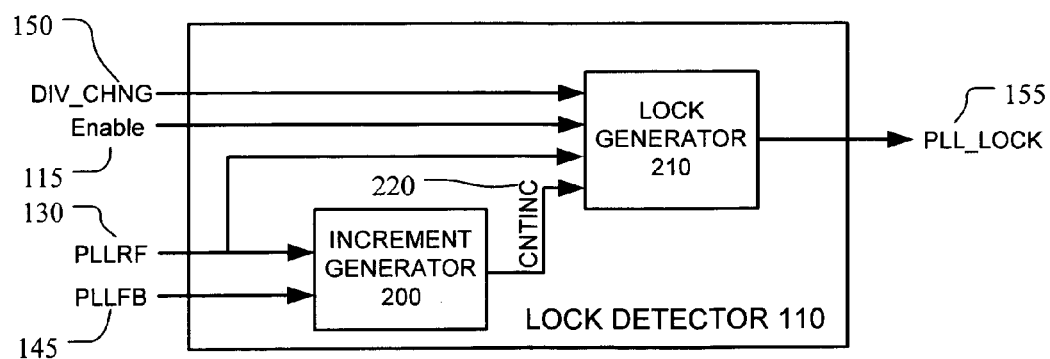
FIG. 2 is a block diagram of one embodiment of a PLL lock detector.

FIG. 2 is a block diagram of one embodiment of PLL lock detector 110 from FIG. 1. Lock detector 110 includes increment generator 200, which receives reference signal 130 and feedback signal 145. Lock generator 210 receives divider change signal 150, enable signal 115, reference signal 130 and count increment signal 220. Lock generator 210 transmits an output signal on output line 155.

Increment generator 200 samples feedback signal 145 with reference signal 130 and determines if the feedback signal is at different polarities at consecutive rising and falling edges of the reference signal. If there is a polarity change in the feedback signal 145 between consecutive edges of reference signal 130, then count increment signal 220 is asserted from increment generator 200 to lock generator 210.

Lock generator 210 receives count increment signal 220 and either increments the count or resets it. The lock generator 210 compares the value of the count to the defined value, which may be adjustable or fixed. If the count equals the defined value then lock generator 210 asserts a phase lock indicator on output line 155.

Figure 3:
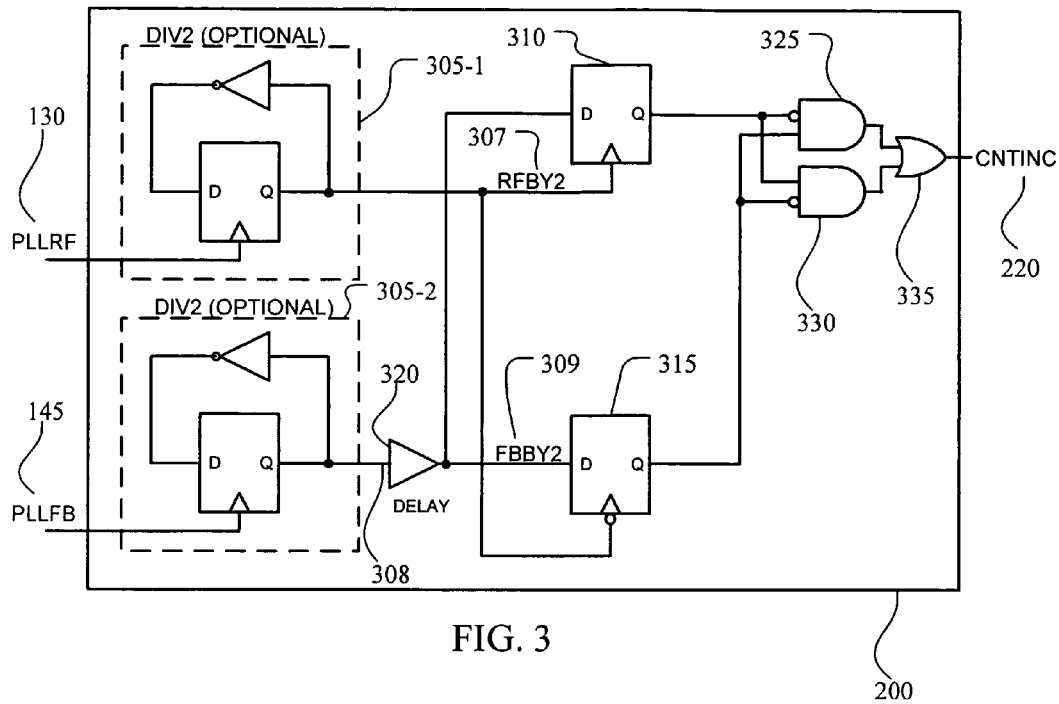
FIG. 3 is a block diagram of one embodiment of a component of a PLL lock detector.

FIG. 3 is a block diagram of one embodiment of increment generator 200 from FIG. 2. Increment generator 200 may include optional divider circuits 305-1 and 305-2 (collectively referred to with reference numeral 305). Assuming the presence of divider circuits 305-1 in this embodiment, divider circuit 305-1 receives reference signal 130 while divider circuit 305-2 receives feedback signal 145. Divider circuit 305-1 outputs reference signal 130 divided by two (RFBY2) signal 307, for example, while divider circuit 305-2 outputs feedback signal 145 divided by two, resulting in feedback signal 308. Delay 320 may delay feedback signal 308 in order to offset reference signal 307 from feedback signal 308 in case the signals are too close to each other, a possibility with PLL circuits, in order to prevent metastability (unknown) state in register 310 and 315. Registers 310 and 315 each receive reference signal 307 as a clock and feedback signal 309 as input. AND gates 325 and 330 receive input from registers 310 and 315, and transmit an output to OR gate 335, which transmits count increment signal 220 to lock generator 210.

Optional divider circuits 305 may be implemented if dividers 125 and 135 do not produce 50% duty cycle signals. Divider circuits 305 are well known in the art and may cut the frequency of a signal by half and make the signal 50% duty cycle. Divider circuits 305 may be implemented if dividers 125 and 135 do not produce 50% duty cycle signals, otherwise they man not be implemented.

Register 310 receives delayed (if necessary) feedback signal 309 as input with a clock on reference signal 307. Register 310 is an edge-triggered register that captures the value of the input (feedback signal 309), on each rising or falling edge. In this embodiment, register 310 is a rising edge triggered register. The configuration of register 310 determines whether the edge is rising or falling at the time of capture. Meanwhile, register 315 receives delayed (if necessary) feedback signal 309 as input with a clock on reference signal 307. The clock for register 315 is inverted in comparison to register 310. Register 315 is an edge-triggered register that captures the value of the input (feedback signal 309), on each rising or falling edge. Because the clock on register 315 is inverted from the clock on register 310, one of the two registers captures the value of feedback signal 309 on the rising edge of reference signal 307, and the other register captures the value of feedback signal 309 on the falling edge of reference signal 307. In this embodiment, register 315 is a falling edge triggered register.

AND gates 325 and 330 each have one inverted input. The result of the one inverted input is that AND gates 325 and 330 transmit a high signal only when output from one of registers 310 and 315 is low while the other is high. When both registers 310 and 315 are low, or both are high, AND gates 325 and 330 transmit only low. The output signals from AND gates 325 and 330 combine in OR gate 335.

OR gate 335 therefore transmits count increment signal 220 as high when registers 310 and 315 capture feedback signal 309 in different polarities at the rising and falling edges of reference signal 307, otherwise receiving low inputs and having a low output.

Figure 4:
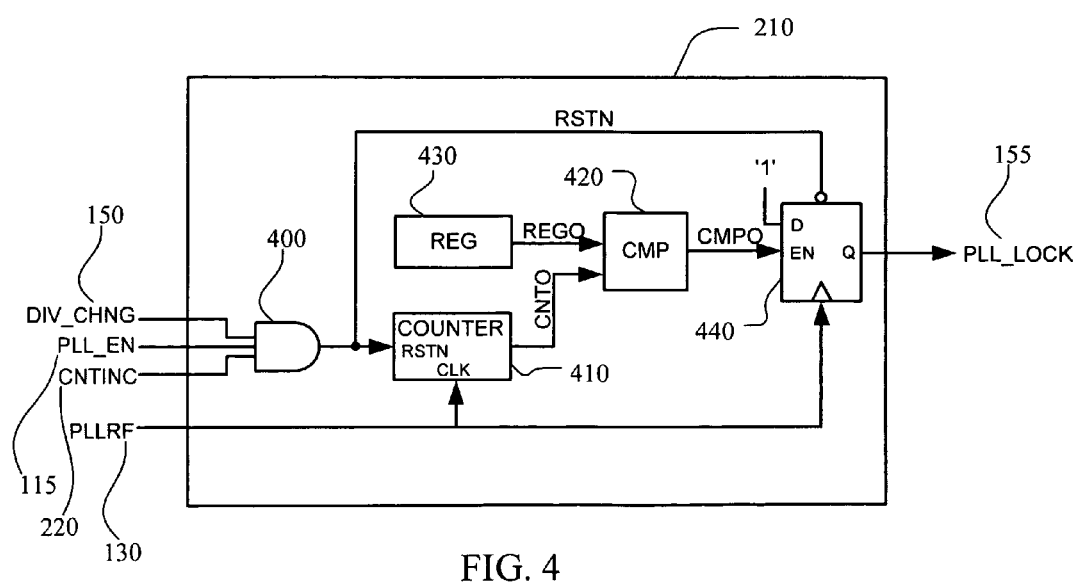
FIG. 4 is a block diagram of one embodiment of a component of a PLL lock detector.

FIG. 4 is a block diagram of one embodiment of lock generator 210 from FIG. 2. Lock detector includes AND gate 400, which receives divider change signal 150, enable signal 115, count increment signal 220. Counter 410 receives inputs from AND gate 400 and reference signal 130. Comparator 420 receives inputs from counter 410 and register 430. Comparator 420 transmits a signal to register 440, which transmits a phase lock indicator signal on output line 155.

AND gate 400 produces a high output when asserted or receiving high from all of divider change signal 150, enable signal 115 and count increment signal 220. In this example, divider change is high when M and N values have not changed, while enable is high when PLL 105 is enabled and count increment signal 220 is high when feedback signal 309 is different at consecutive edges of reference signal 307, as described in FIG. 3. Upon receiving all high, or assert signals, AND gate 400 transmits a high, or assert signal to counter 410. When counter 410 receives high, or an assert signal, it increments a count that is stored within counter 410 on every edge of the reference signal 130. When counter 410 receives a low, or a deassert signal, it resets the count to zero.

Register 430 holds the defined value, which may be one-time programmable, reprogrammable, or fixed. Comparator 420 compares the defined value from register 430 with the count from counter 410. If the defined value and the count are not equal, comparator 420 outputs a low value, or deasserts register 440.

Register 440 deasserts phase lock upon start up and if register 440 receives a deassert, or low value from AND gate 400. AND gate 400 may transmit a low output if the system disables the PLL and the lock detector 110 with the enable signal 115 (for example, for power conservation), or if the M and/or N values of the dividers 125 and 135 are changed, and PLL 105 must lock onto the new frequency, for example. Register 440 continues to deassert phase lock until receiving a high, or assert value at the enable input for register 440. The captured value is tied high and is then output as an assertion of phase lock on output line 155.

Figure 5:
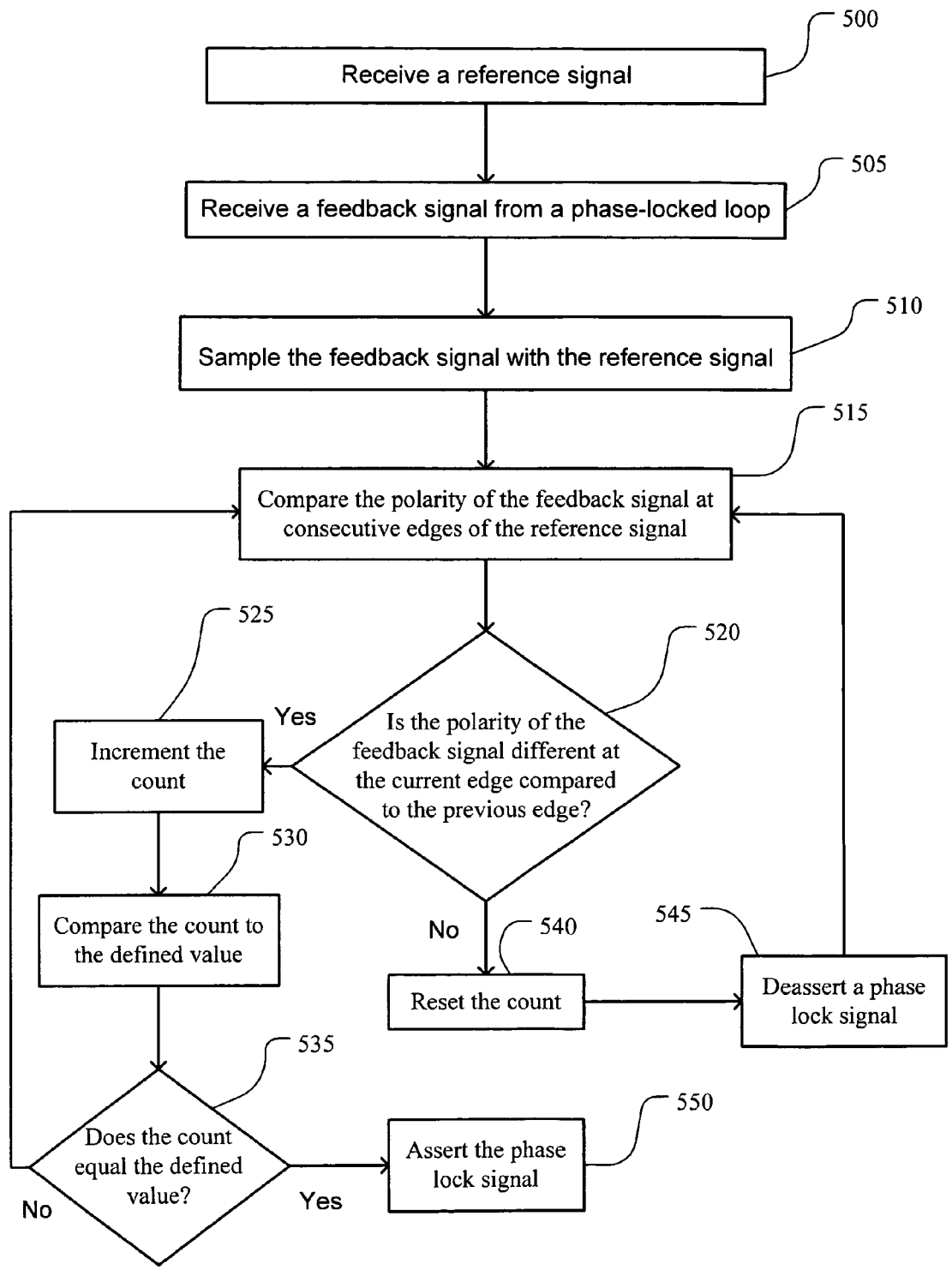
FIG. 5 is a flow diagram illustrating one method of detecting phase lock in a system with a PLL.

FIG. 5 is a flow diagram illustrating one method of detecting phase lock in a system with a PLL. FIGS. 5 and 6 will be discussed in conjunction with FIGS. 1, 2, 3, and 4. FIG. 6 is a timing diagram illustrating signaling in one embodiment of the invention. For ease of reference, FIG. 1 includes reference numerals beginning with one hundred, FIG. 2 includes reference numerals beginning with two hundred, FIG. 3 includes reference numerals beginning with three hundred, and FIG. 4 includes reference numerals beginning with four hundred.

In FIG. 5, in block 500, lock detector 110 receives reference signal 130. If divider 125 is not present then reference signals 120 and 130 are identical. Wave 600 represents reference signal 130.

In block 505, lock detector 110 receives feedback signal 145 from PLL 105. Wave 602 represents feedback signal 145.

Assume the presence of dividers 305. Wave 604 represents reference signal 307, which is the output of divider 305-1 with an input of reference signal 130. Wave 604 has 50% duty cycle, although waves 600 and 604 may not have the same frequency. Similarly, wave 606 represents feedback signal 309, which is the delayed output of divider 305-2 with an input of feedback signal 145.

In block 510, registers 310 and 315 sample feedback signal 309 with reference signal 307. Sampling of feedback signal 309 is represented by times 608-1, 608-2, 608-3, 608-4, 608-5, 608-6 and 608-7 (collectively referred to with reference numeral 608).

In block 515, lock detector 110 compares the polarity of feedback signal 309 at consecutive edges of reference signal 307, using the combination of AND gates 325 and 330, and OR gate 335. "Edges" of a signal refer to either the falling edge or the rising edge of what is typically a square wave for a clock signal. For example, the first edge of wave 604 is at time 608-1. Time 608-1 intersects wave 606 at a low, or zero value. The next, or consecutive edge of wave 604 is at time 608-2. Time 608-2 intersects wave 606 at a high, or one value.

In block 520, lock detector 110 determines if the polarity of feedback signal 309 is different at the current edge compared to the previous edge. If the current cycle is represented at time 608-2 then yes, the polarity of wave 606 at the intersection of time 608-2 (high) is different than the polarity of wave 606 at the intersection of time 608-1 (low). Increment generator 200 provides this information from OR gate 335 in increment generator 200 to AND gate 400 in lock generator 210.

Due to the affirmative decision in block 520, in block 525, lock detector 110 increments the count by incrementing counter 410. The count may be represented by data 610. Assuming the count started at zero, the count in counter 410 is incremented after time 608-2 from zero to one. A count increment signal is represented by wave 609, which goes from low to high at time 608-2, and is transmitted from AND gate 400 to counter 410.

In block 530, lock detector 110 compares the count to the defined value with comparator 420 in lock generator 210. The defined value may be stored in register 430. The defined value is typically a number of consecutive cycles during which feedback signal 309 tracks reference signal 307, after which it may be assumed that PLL 105 is locked. The defined value may be determined by simulating the amount of time taken for PLL 105 to lock and taking a number corresponding to the number of clock cycles needed to reach that amount of time, or a low, average or high value over repeated simulations. The defined value may be any integer. Assume that in this example the defined value is eight.

In block 535, lock detector 110 determines if the count equals the defined value. Soon after time 608-2, data 610 is one, which is not equal to eight, so wave 612, representing a compare signal, is low. Wave 612 represents the output of comparator 420. It may also be assumed that PLL lock signal, represented by wave 614, is also low. PLL lock may go or start low due to system 100 being first activated, reset, disabled then reactivated, dividers 125 or 135 being reset, and so on.

Because the count (one) does not equal the defined value (eight), lock detector 110 continues with block 515. The next edge of wave 604 for reference signal 130 is at time 608-3. At time 608-3, wave 606 for feedback signal 145 is low, which when compared to wave 606 at time 608-2 yields the conclusion that the polarity of wave 606 has changed. Therefore in block 525, wave 609 for the count increment signal stays high and the count value goes from one to two in data 610. The count is not equal to eight, so wave 612 for the compare signal stays low and wave 614 for PLL lock stays low.

Returning to block 515, the next edge of wave 604 for reference signal 130 is at time 608-4. At time 608-4, wave 606 for feedback signal 145 is low, which when compared to wave 606 at time 608-3 yields the conclusion that the polarity of wave 606 has not changed.

Therefore, in block 540, lock detector 110 sends wave 609 for the count increment signal to zero and resets the count to zero in data 610, after time 608-4. In this example, count increment signal 220 goes low, causing AND gate 400 to reset counter 410. In another process, block 540 may be initiated with a reset or through receiving divider change signal 150, which may alternatively indicate a reset.

In block 545, in case phase lock was previously asserted, lock detector 110 deasserts the phase lock signal and PLL lock detector 110 may continue to block 515.

System 100 may continue in the manner described above for any number of cycles. At some point in time, for example after time 608-5, data 610 for the value of the count in counter 410 goes to seven. The next edge of wave 604 for reference signal 307 is at time 608-6. At time 608-6, wave 606 for feedback signal 309 is low, which when compared to wave 606 at time 608-5 yields the conclusion that the polarity of wave 606 has changed. Therefore, in block 525, wave 609 for the count increment signal stays high and the count value goes from seven to eight in data 610. The count is equal to eight, which is the defined value stored in register 430 in this example, so wave 612 for the compare signal goes high between times 608-6 and 608-7.

Next, in block 550, lock detector 110 asserts the phase lock signal and wave 614 goes high at time 608-7, indicating that PLL output 140 is stable. Comparator 420 transmits an assert signal to register 440, which captures a high value and asserts the PLL lock on output line 155. Lock generator 210 may process blocks 525–550 of FIG. 2.

Advantages of the invention include ease of implementing in current PLL systems, it is simpler than other solutions, requiring fewer components and costing less money to build, and may be fully digital.

According to the method and system disclosed herein, the present invention provides a method and system for a lock detector for a phase-locked loop (PLL). One skilled in the art will recognize that many other logic combinations are possible, with all the signals reversed or even other combination applied. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

I claim:

1. A lock detector for a phase-locked loop, comprising:
   a first generator for receiving a feedback signal from the phase-locked loop and a reference signal, and for sampling the feedback signal with the reference signal;
   a second generator coupled to the first generator for incrementing a count when the feedback signal is at different polarities at consecutive edges of the reference signal; and
   an output line coupled to the second generator for asserting a phase lock when the count reaches a defined value.

2. The lock detector of claim 1, wherein the first generator is an increment generator further comprising:
   a first register for receiving the feedback signal and clocked with the reference signal, and for outputting the polarity of the feedback signal on the rising edge of the reference signal; and a second register for receiving the feedback signal and clocked with the reference signal, and for outputting the polarity of the feedback signal on the falling edge of the reference signal.

3. The lock detector of claim 2, the increment generator further comprising:
a first AND gate coupled to the first and second registers for receiving an inverted signal from the first register;
a second AND gate coupled to the first and second registers for receiving an inverted signal from the second register; and
an OR gate coupled to and for receiving input from the first and second AND gates, and for producing output to the lock generator.

4. The lock detector of claim 2, the increment generator further comprising:
a reference frequency dividing circuit coupled to the first and second registers and configured to supply a 50% duty cycle of the reference signal.

5. The lock detector of claim 2, the increment generator further comprising:
a feedback frequency dividing circuit coupled to the first and second registers and configured to supply a 50% duty cycle of the feedback signal.

6. The lock detector of claim 1, wherein the second generator is a lock generator further configured to reset the count when the feedback signal is at the same polarity at two consecutive edges of the reference signal.

7. The lock detector of claim 6, the lock generator further comprising:
a counter coupled to the first generator for counting the number of consecutive edges of the reference signal at which the feedback signal switches polarities;
a register for maintaining the defined value; and
a comparator coupled to the register and the counter, for comparing the count to the defined value, wherein the count is the number of consecutive edges of the reference signal at which the feedback signal switches polarities.

8. The lock detector of claim 7, the counter clocked by the reference signal.

9. The lock detector of claim 7, the lock generator further comprising:
a register coupled to the comparator and configured to assert the phase lock when the count reaches the defined value.

10. The lock detector of claim 9, the register clocked by the reference signal.

11. The lock detector of claim 9, the lock generator further comprising:
an AND gate coupled to the first generator and the counter, for receiving a signal from the first generator and an enable signal, and for enabling the counter when the feedback signal is at different polarities at consecutive edges of the reference signal while receiving the enable signal.

12. The lock detector of claim 11, the AND gate coupled to the register and further configured to reset the register and the counter when the feedback signal is the same polarity at consecutive edges of the reference signal.

13. A phase-locked loop system receiving a reference signal, comprising:
a phase-locked loop for receiving the reference signal and for generating a feedback signal; and
a lock detector coupled to the phase-locked loop for receiving the feedback and reference signals, and for sampling the feedback signal with the reference signal, and for incrementing a count when the feedback signal is at different polarities at consecutive edges of the reference signal, and for asserting a phase lock when the count reaches a defined value.

14. The system of claim 13 further comprising:
a reference frequency dividing circuit coupled to the phase-locked loop and to the lock detector, for supplying the reference signal at a 50% duty cycle.

15. The system of claim 13 further comprising:
a feedback frequency dividing circuit coupled to the phase-locked loop and to the lock detector, for supplying the feedback signal at a 50% duty cycle.

16. The system of claim 13, for receiving an enable signal at the phase-locked loop and the lock detector, the phase-locked loop and the lock detector operating when enabled by the enable signal.

17. The system of claim 13 further comprising a divider-change input to the lock detector, the lock detector resetting the count and deasserting the phase lock when asserted by the divider-change input, wherein the divider-change input assertion reflects a change in the reference frequency or the feedback frequency.

18. A method for detecting phase-lock of a phase-locked loop comprising:
receiving a reference signal;
receiving a feedback signal from the phase-locked loop;
sampling the feedback signal with the reference signal;
incrementing a count when the feedback signal is at different polarities at consecutive edges of the reference signal; and
asserting a phase lock when the count reaches a defined value.

19. The method of claim 18 further comprising:
resetting the count when the feedback signal is at the same polarity at consecutive edges of the reference signal; and
deasserting the phase lock when the count is reset.

20. The method of claim 19 further comprising:
resetting the count when the feedback signal or the reference signal changes frequency; and
deasserting the phase lock when the count is reset.

* * * * *